United States Patent
Tan

(10) Patent No.: US 11,948,809 B2
(45) Date of Patent: Apr. 2, 2024

(54) METHOD FOR UNDERFILLING USING SPACERS

(71) Applicant: Delphi Technologies IP Limited, St. Michael (BB)

(72) Inventor: Whei Sheng Tan, Woodlands (SG)

(73) Assignee: Delphi Technologies IP Limited, St. Michael (BB)

( * ) Notice: Subject to any disclaimer, the term of this patent is extended or adjusted under 35 U.S.C. 154(b) by 157 days.

(21) Appl. No.: 17/474,674

(22) Filed: Sep. 14, 2021

(65) Prior Publication Data

US 2023/0082626 A1  Mar. 16, 2023

(51) Int. Cl.
| | |
|---|---|
| *H01L 23/16* | (2006.01) |
| *H01L 21/56* | (2006.01) |
| *H01L 23/00* | (2006.01) |
| *H01L 23/498* | (2006.01) |
| *H05K 1/18* | (2006.01) |

(52) U.S. Cl.
CPC ............ *H01L 21/563* (2013.01); *H01L 23/16* (2013.01); *H01L 23/49816* (2013.01); *H01L 24/10* (2013.01); *H05K 1/181* (2013.01); *H01L 2224/10155* (2013.01); *H05K 2201/10568* (2013.01)

(58) Field of Classification Search
CPC ......... H01L 23/16; H01L 23/18; H01L 23/42; H01L 23/433; H01L 23/4334; H01L 23/28; H01L 23/563
See application file for complete search history.

(56) References Cited

U.S. PATENT DOCUMENTS

| | | | | |
|---|---|---|---|---|
| 8,324,718 B2 * | 12/2012 | Honda | ................. | H01L 21/563 |
| | | | | 257/789 |
| 8,796,075 B2 | 8/2014 | Babiarz et al. | | |
| 11,069,623 B2 * | 7/2021 | Kwon | ..................... | H01L 25/18 |
| 2006/0088957 A1 | 4/2006 | Saeki | | |
| 2010/0255641 A1 | 10/2010 | Nakanishi et al. | | |
| 2017/0287875 A1 | 10/2017 | Gao et al. | | |
| 2018/0138101 A1 * | 5/2018 | Yu | ......................... | H01L 23/481 |
| 2019/0189537 A1 * | 6/2019 | Fujino | ..................... | H01L 23/48 |
| 2019/0348340 A1 * | 11/2019 | Kwon | ................. | H01L 23/3675 |
| 2019/0348343 A1 * | 11/2019 | Kwon | ..................... | H01L 24/17 |
| 2021/0225665 A1 | 7/2021 | Sinha et al. | | |
| 2022/0157777 A1 * | 5/2022 | Yang | ..................... | H01L 21/563 |
| 2022/0285289 A1 * | 9/2022 | Hsieh | ................. | H01L 23/4006 |
| 2023/0163100 A1 * | 5/2023 | Sakuma | ................. | H01L 23/36 |
| | | | | 257/700 |

OTHER PUBLICATIONS

Extended European Search Report from EP Application 22192255.2, dated Feb. 10, 2023 (12 pages).

* cited by examiner

*Primary Examiner* — Marcos D. Pizarro
*Assistant Examiner* — William Henry Anderson
(74) *Attorney, Agent, or Firm* — Joshua M. Haines; Bookoff McAndrews, PLLC

(57) ABSTRACT

A method for underfilling an electronic circuit assembly may include mounting one or more structures to a substrate, mounting one or more spacers to the substrate at one or more positions, respectively, to form one or more passages between the one or more spacers and the one or more structures, dispensing underfill to the one or more passages, and curing the underfill to secure the one or more structures to the substrate. The one or more structures may include one or more dies.

19 Claims, 11 Drawing Sheets

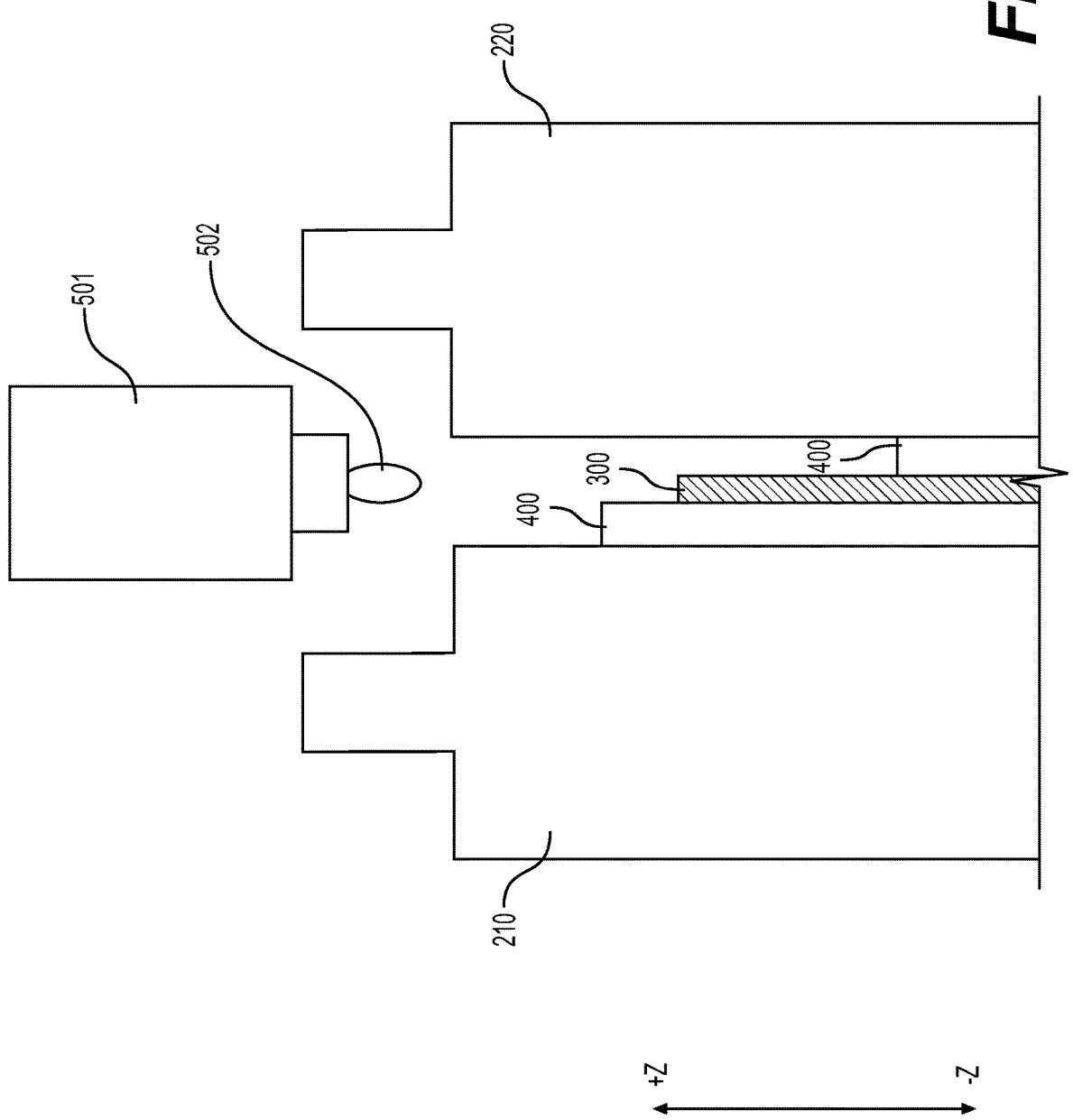

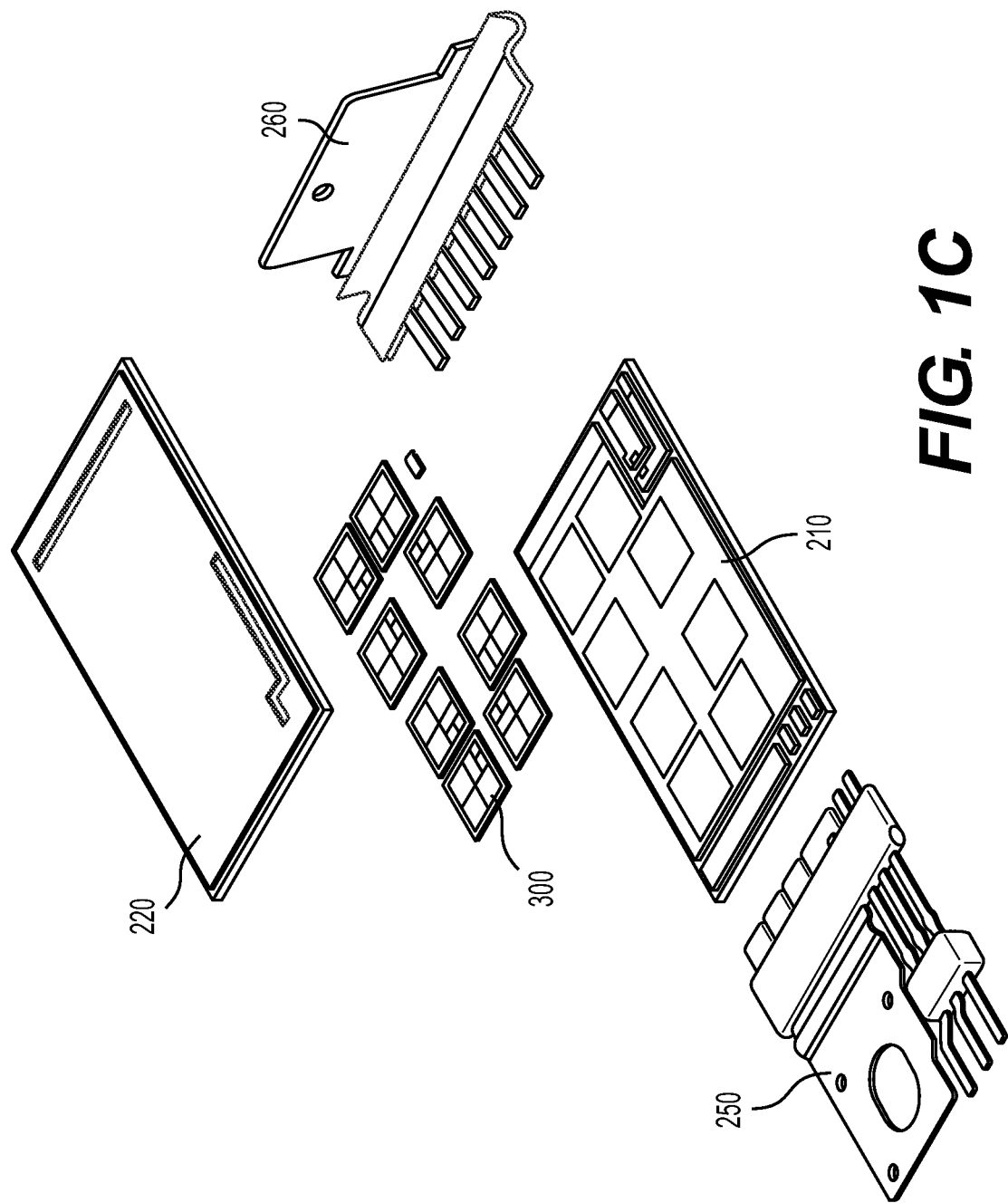

METHOD FOR UNDERFILLING USING SPACERS

TECHNICAL FIELD

Various embodiments of the present disclosure relate generally to underfill processes for electronic circuit assemblies and, more particularly, to an underfill method using spacers to reduce spillage and air pockets.

BACKGROUND

Electronic circuit assemblies must often survive hostile operating environments, including those commonly found in automotive and aerospace applications. When electronic devices (e.g., flip chips, dies, etc.) are mounted to a substrate (e.g., printed circuit board or wafer), there may be an open space between the electronic device and substrate created by solder joints and also a lateral open space between two or more electronic devices.

Underfill (e.g., epoxy) may be dispensed into the open space and then cured to add stability and rigidity to the electronic circuit assembly. The underfill may protect solder joints against various adverse environmental factors, redistribute mechanical stresses due to shock, prevent the solder joints from moving under strain during thermal cycles, and create a moisture barrier to prevent damage and short circuits. Underfill may also be used as an intermediary between mismatched coefficients of thermal expansion (CTEs) between the electronic devices and the substrate.

SUMMARY OF THE DISCLOSURE

According to certain aspects of the disclosure, a method for underfilling an electronic circuit assembly may include mounting one or more structures to a substrate, mounting one or more spacers to the substrate at one or more positions, respectively, to form one or more passages between the one or more spacers and the one or more structures, dispensing underfill to the one or more passages, and curing the underfill to secure the one or more structures to the substrate. The one or more structures may include one or more dies.

Mounting the one or more structures may include mounting a first die to be spaced apart from an edge by a first distance. The edge may be an edge of the substrate or an edge of an adjacent structure among the one or more structures. Mounting the one or more spacers to the substrate at the one or more positions may include mounting a first spacer at a first position to form a first passage between the first die and the first spacer and a second passage between the first spacer and the edge.

The first passage may have a first width less than 45% of the first distance. The second passage may have a second width less than 45% of the first distance. The first distance may be in a range of 1.5 to 2.5 mm. The first passage may have a first width in a range of 0.1 mm to 0.9 mm.

Mounting the one or more structures may include mounting a first die to be spaced apart from an edge by a first distance. The edge may be an edge of the substrate or an edge of an adjacent structure among the one or more structures Mounting the one or more spacers to the substrate may include mounting a first spacer between the first die and the edge. The one or more spacers may have a width equal to at least 15% of the first distance.

Mounting the one or more structures may include mounting a first die to be spaced apart from an edge by a first distance. The edge may be an edge of the substrate or an edge of an adjacent structure among the one or more structures. The first distance may extend in a first direction. The first die may have a first length and the edge may have a second length. The first and second lengths may extend in a second direction. The one or more spacers may include a plurality of spacers aligned in the second direction.

The substrate may be a first substrate. The one or more dies may be mounted to the first substrate and a second substrate. The one or more spacers may be mounted to the first substrate. During dispensing underfill to the one or more passages, the first and second substrates may be oriented vertically.

The one or more spacers may not be electrically connected to any conductive traces. The one or more spacers may have a height of at least 75% a height of the die. A height of the one or more spacers may be in a range of 0.15-0.18 mm. A height of the one or more dies may be in a range of 0.17-0.20 mm.

A sum of volumes of each of the one or more spacers may be equal to at least 10% of a reference volume. The reference volume may be a sum of volumes of each of the one or more structures subtracted from an initial substrate volume.

The one or more dies may include a silicon carbide (SiC) die. The substrate may be a silicon nitride ($Si_3N_4$) substrate. The method may further include applying a vacuum to the electronic circuit assembly to remove air trapped in the dispensed underfill.

According to certain aspects of the disclosure, an electronic circuit assembly may include a substrate, one or more structures mounted to the substrate, and one or more spacers mounted to the substrate. The one or more structures may include a first die. The one or more spacers may include a first spacer mounted between the first die and an edge. The edge may be an edge of a structure adjacent to the first die or an edge of the substrate adjacent to the first die. The first die and the edge may be spaced apart by a first distance. The first die and the first spacer may be spaced apart by a second distance. The second distance may be at least 70% less than the first distance. The one or more spacers may be positioned to not interfere with any circuit throughout the electronic circuit assembly.

The first distance may be in a range of 1.5 to 2.5 mm. The second distance may be in a range of 0.1 mm to 0.9 mm. The substrate may include a silicon nitride ($Si_3N_4$) material. The spacers may be soldered directly on the silicon nitride material with a soldering material that does not touch any conductive traces on the substrate.

A height of the first die may be in a range of 0.17-0.20 mm. A height of each of the one or more spacers may be in a range of 0.15-0.18 mm.

According to certain aspects of the disclosure, a method for underfilling an electronic circuit assembly may include mounting one or more dies to a substrate, mounting one or more spacers to the substrate, dispensing underfill at a location configured to compel a flow of the underfill between the one or more spacers and the one or more dies, and curing the underfill to secure the one or more dies to the substrate. A total volume of the one or more spacers may be configured to fill at least 10% of empty space above the substrate.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

FIG. 1B depicts an example of an electronic circuit assembly arranged vertically during an underfill process according to an embodiment.

FIG. 1C depicts an exploded perspective view of an electronic circuit assembly including a pair of lead frames.

DETAILED DESCRIPTION OF EMBODIMENTS

Figure 1A:
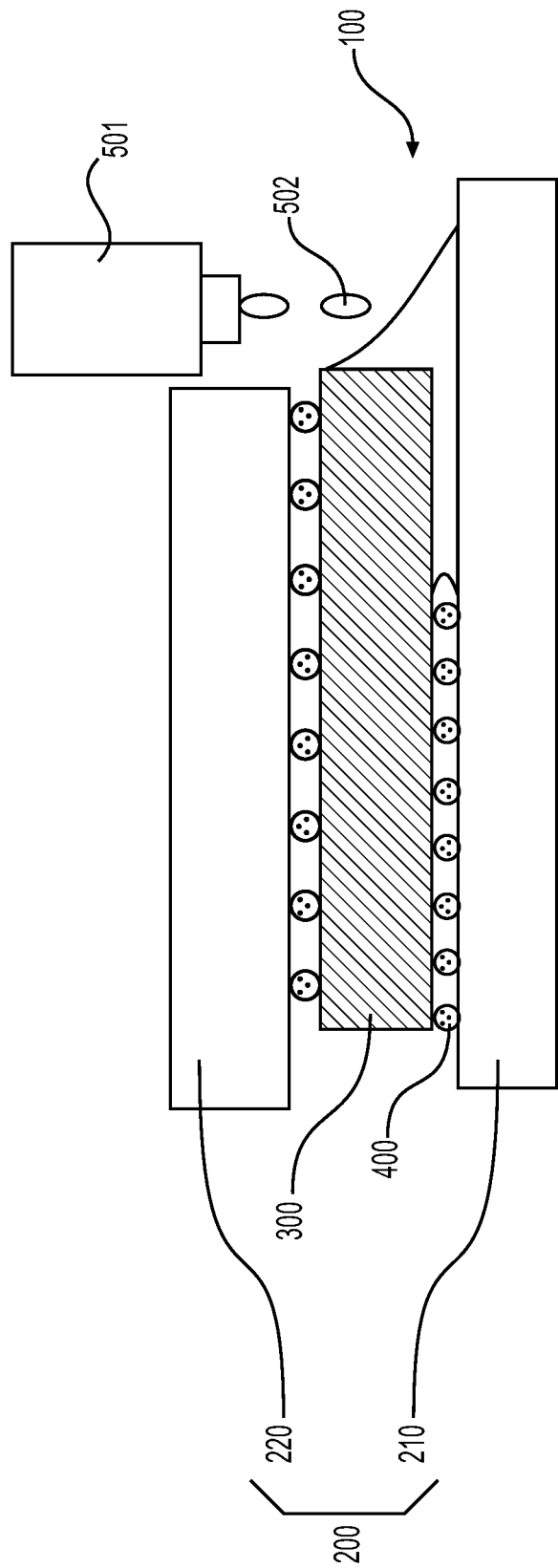
FIG. 1A depicts a side view of an electronic circuit assembly arranged horizontally during an underfill process according to an embodiment.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

Various embodiments of the present disclosure relate generally to underfill processes for electronic circuit assemblies and, more particularly, to an underfill method using spacers to reduce spillage and air pockets. The spacers may be arranged on a substrate of the electronic circuit assembly to reduce spillage and air pockets. The resulting electronic circuit assembly may be more reliable and provide a smoother surface that better accepts coatings (e.g., in heat sink applications). The resulting electronic circuit assembly may also result in a more efficient manufacturing process by reducing or eliminating a need for repeating the manufacturing process when excess underfill spilled over and cured on an outer surface may render the resulting electronic circuit assembly unusable or unsuitable for its intended application. The disclosed embodiments may therefore also reduce a manufacturing yield loss by reducing a number of discarded assembled electronic circuit assemblies and also by reducing an amount of underfill needed.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section.

The term "electronic device" may broadly refer to a device or circuitry component configured to be mounted on a substrate, such as a chip, flip chip, chip scale package, ball grid array (BGA), package on package assembly (Pop), diode, transistor, or a die (e.g., a die or chip that has been encapsulated in an organic, an inorganic, or a combination organic and inorganic housing). The term "substrate" may broadly refer to a wafer or a board that acts as a mounting substrate for the electronic device (e.g., a resin-impregnated fiberglass structure).

The disclosed embodiments may reduce or eliminate a spilling of underfill around edges and/or over an electronic device and thus reduce or eliminate an excess of underfill that may need to be removed or that may cause the assembled electronic circuit assembly to be discarded. The disclosed embodiments may reduce or eliminate a manufacturing yield loss resulting from excess underfill and/or poor quality assembled products resulting from the excess underfill, and reduce a manufacturing time by reducing or eliminating the excess underfill and/or resulting assembled products which may be unusable due to such excess. The disclosed embodiments may also assist a coating process by reducing or eliminating excess underfill (such as in heat sink applications) which may interfere with a smooth coating.

The disclosed embodiments may reduce or eliminate air pockets formed between an electronic device and a substrate during an underfill process (e.g., during a vacuum de-airing process) and may also reduce or eliminate a spilling or boiling over of the underfill. By reducing air pockets, the disclosed embodiments may also enhance a rigidity of the cured underfill.

Current underfill compositions are becoming increasingly viscous, which may frustrate a flow of underfill by capillary action. The disclosed embodiments may enhance capillary action on the underfill during the underfill process. The disclosed embodiments may also help to create a more uniform width of a passage through which the underfill flows and also help to create a more regular, even flow of the underflow.

Aspects of the present disclosure may tailor electronic circuit assemblies to reduce a volume of underfill needed during manufacturing, reduce air pockets, enhance capillary action during an underfill process, and reduce a number of times an underfill process results in a poor quality electronic circuit assembly and thus a number of times an underfill process may be repeated. Current underfill processes typically lead to air pockets within the underfill and high spillage of the underfill over the electronic devices, leading to manufacturing yield loss of the underfill, increased manufacturing time in removing the excess underfill, a less rigid electronic circuit assembly, and a less uniform coating over the final electronic circuit assembly that may occur when the underfill spills over and cures onto the outer surface. Spillage onto the outer surface may need to be removed, or the assembled electronic circuit assembly may need to be discarded and the manufacturing process repeated. Aspects of the disclosure may solve these problems by reducing an amount of underfill used during the underfill process, which may reduce or eliminate a number of air pockets formed in the underfill, reduce or eliminate spillage, and reduce or eliminate repetitive manufacturing. Aspects of the disclosure may be used in inverter systems or power switches that convert direct current (DC) power (e.g., 12-volt) to alternating current (AC) power (e.g., 120-volt), such as those used in electrically-powered automobiles.

Figure 2:
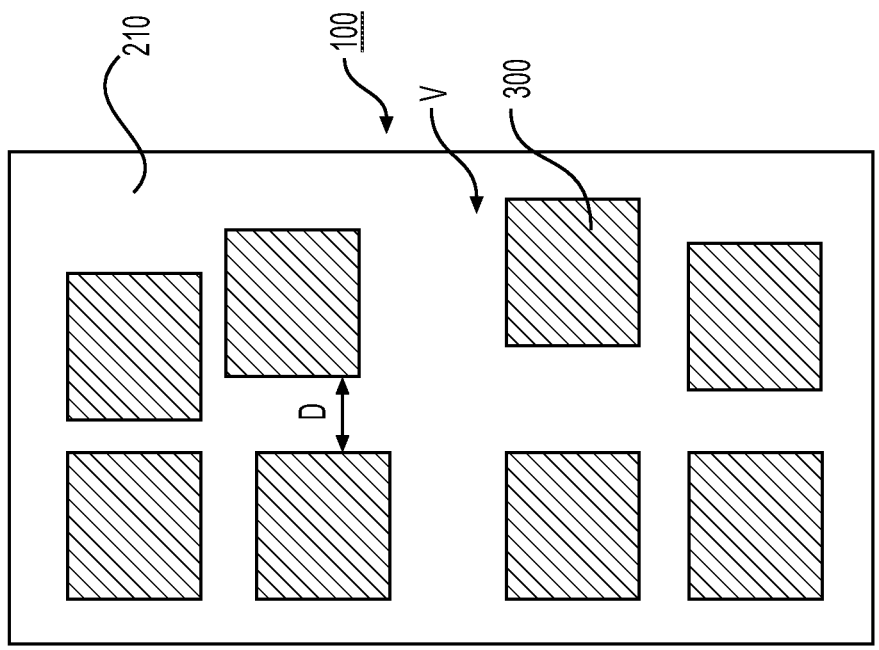
FIG. 2 depicts a plan view of an inner side of a substrate before underfilling according to an embodiment.
Figure 2:
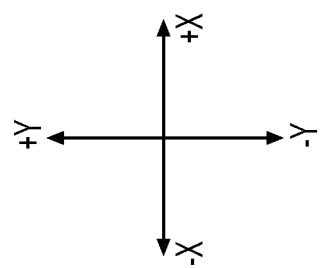

FIGS. 1A and 1B depict an electronic circuit assembly during an underfill process, FIG. 1C depicts an exploded perspective view of an electronic circuit assembly including lead frames, and FIG. 2 depicts an inner side of a substrate of an electronic circuit assembly before underfilling.

Referring to FIGS. 1A, 1B, and 2, an electronic circuit assembly 100 may include at least one substrate 200 and at least one electronic device (e.g., die or chip) 300 mounted (e.g., soldered) to the substrate 200. At least one side of the electronic device 300 may include solder bumps or joints 400 configured to align with solder pads on the substrate 200 during mounting. The solder bumps 400 may create a space between the electronic device 300 and the substrate 200. Alternatively, when solder joints 400 are used, the solder joints 400 may fill a distance between the electronic device 300 and the substrate 200, leaving no space (see, for example, FIG. 1B). Alternatively or in addition to solder bumps or joints 400, sintering joints or material may be used to mount the electronic device 300.

The substrate 200 may include a first or base substrate 210 and a second or cap substrate 220. The electronic device 300 may be mounted to both the first and second substrates 210 and 220. Although two substrates 210 and 220 are not required, for convenience of description, an example where the electronic circuit assembly 100 includes the first substrate 210 and the second substrate 220 will be described.

Once mounted, an underfill dispenser 501 may dispense underfill 502 at an edge of at least one of the first or second substrate 210 or 220, or alternatively at an edge of the electronic device 300. The underfill 502 may initially be a fluid or liquid material and flow into an empty space between the first substrate 210, second substrate 220, and structures mounted to the first and/or second substrates 220 and/or 220 (e.g., the electronic device 300) by capillary action or forces.

As exemplified in FIG. 1A, the electronic circuit assembly 100 may be oriented horizontally during underfilling such that the first and second substrates 210 and 220 are spaced apart in the Z-direction. As exemplified in FIG. 1B, the electronic circuit assembly 100 may be oriented vertically during underfilling such that the first and second substrates 210 and 220 are spaced apart in a lateral (e.g., X or Y) direction. Where the first and second substrates 210 and 220 have equal footprints or lateral dimensions, the electronic circuit assembly 100 may be oriented vertically. Where the first and second substrates 210 and 220 are rectangular, in a vertical orientation, longer edges may extend in a vertical direction, or alternatively, shorter edges may extend in a vertical direction. Where the first and second substrates 210 and 220 have unequal footprints, the electronic circuit assembly 100 may be oriented horizontally. As another alternative, the electronic circuit assembly 100 may be provided on an inclined surface so that gravity may assist a flow of the underfill 502.

As exemplified in FIG. 1C, a first lead frame 250 (e.g., gate-emitter) may be provided at a side of the first and second substrates 210 and 220 which is perpendicular to a side from which underfill 502 is dispensed. For example, when the first and second substrates 210 and 220 are rectangular, the first lead frame 250 may be provided at a shorter side, while underfill may be dispensed at a longer side. A second lead frame 260 (e.g., collector) may be provided at a side of the first and second substrates 210 and 220 opposite to the side having the first lead frame 250.

The first and second lead frames 250 and 260 may provide mechanical support, heat dissipation, and/or be configured to transmit a signal. The first and second lead frames 250 and 260 may initially lay flat, and then may be bent during manufacturing. Lead frame 250 in FIG. 1C exemplifies a state where the lead frame 250 may lay flat before bending, and lead frame 260 in FIG. 1C exemplifies a state where the lead frame 260 has been bent. Embodiments disclosed herein are not limited to an implementation of the first and second lead frames 250 and 260. During underfilling, some underfill 502 may spill onto the first and second lead frames 250 and 260, which may enhance electrical isolation. Surface tension and/or capillary forces may prevent the underfill 502 from spilling over a side opposite to a side from which the underfill 502 is dispensed.

After flowing across the first and/or second substrates 210 and 220, the underfill 502 may be heated and cured to harden into a solid material to secure the mounted electronic device 300 between the first and second substrates 210 and 220. Before or during dispensing, a space through which the underfill 502 flows may be vacuumed and/or heated to assist with flow of the underfill 502.

If a flow of the underfill 502 is slow or uneven, air pockets may form in the underfill 502, which may reduce an overall effectiveness of the underfill 502 and reliability of the electronic circuit assembly 100. After the underfill 502 has flowed across the first and second substrates 210 and 220, a vacuum condition may be applied to remove air pockets formed in the underfill 502, which may cause the underfill 502 to spill or bubble. In addition, underfill 502 may spill over and/or collect around the edges of the electronic device 300 and/or the first and second substrates 210, causing excess product.

Such excess product may render the assembled electronic circuit assembly 100 unsuitable or unusable for certain applications. For example, when the electronic circuit assembly 100 is to be coated, excess product may render surfaces of the electronic circuit assembly 100 unsuitable for coating by creating an uneven surface. The excess product may alternatively be removed (e.g., using microbead blasting) before use to salvage the electronic circuit assembly 100, which may add time to a manufacturing process. In cases where the excess underfill renders the electronic circuit assembly 100 unusable, the electronic circuit assembly 100 may have to be discarded, and the manufacturing process may need to be repeated.

The underfill 502 may be a dielectric polymer material or an epoxy material. The effectiveness of the underfill 502 may depend on its chemical, physical, and mechanical properties. A desirable composite for the underfill 502 may have a low coefficient of thermal expansion (CTE), low moisture uptake, high adhesion, high toughness, high glass transition (Tg) temperature, and high heat distortion temperature. The composite for the underfill 502 may include particulate filler inorganics such as silica or metal flakes. The particulate filler may act as a CTE intermediary for mismatched CTEs of the electronic device 300 and the first and second substrates 210 and 220. An example of a silica-filled composite is silica-filled, epoxy-based organics. However, these added CTE-reducing filler particles in current compositions for underfill 502 may increase viscosity of the liquid underfill 502, making it difficult for the underfill 502 to flow by capillary action.

Capillary action refers to a flow of liquid via capillary forces, which are intermolecular cohesive forces acting between the liquid and a surface. Capillary action occurs primarily due to surface tension and other adhesive forces in narrow spaces or passages. When the surface defines a narrow space, capillary forces often overcome gravity. For example, when liquid is provided in a narrow glass tube, surface adhesion may pull the liquid adjacent to the tube slightly upward to create a concave meniscus. On a narrower scale, when a paint brush is dipped in paint, the paint may be drawn up between the hairs of the paint brush through surface adhesion. Such upward flow is a consequence of capillary action.

Capillary action may depend on the surface tension and the density of the liquid. An elevation of the liquid may be estimated using Laplace's equation, where surface tension is directly related to the elevation, and density is inversely related to the elevation. Capillary action may also depend on the dimensions of the space created by the surface. The narrower the space, the greater distance the liquid may be pulled. In the context of the electronic circuit assembly 100, the space through which the underfill 502 flows may include any spaces between the first substrate 210 and the electronic device 300, any spaces between the second substrate 220 and the electronic device 300, and any spaces between the first substrate 210 and the second substrate 220. Underfill 502 may also flow between adjacent components or structures on the substrate 200 (e.g., adjacent electronic devices 300, between an electronic device 300 and an edge of the substrate 200, between an electronic device 300 and other circuitry components, between an electronic device 300 and a wall, etc.) within distances D between those adjacent components (see FIG. 2).

The underfill 502 may occupy a volume V between the first and second substrates 210 and 220, electronic devices 300, and any other circuitry components. This volume V may be estimated by approximating an initial volume of space between the first substrate 210 and the second substrate 220 and subtracting a volume of structures, components (e.g., electronic devices 300, soldering bumps 400), soldering material (e.g., solder pads, conductive traces), etc. from that initial volume. The initial volume of space between the first and second substrates 210 and 220 may be referred to as an "initial substrate volume" and may be equal to an area of the first substrate 210 (or alternatively, the second substrate 220) in the xy-plane multiplied by a substrate height or thickness in the z-direction. Here, the term "initial substrate volume" does not mean a volume of the solid first substrate 210. Rather, the "initial substrate volume" may represent a volume of empty space between the first substrate 210 and the second substrate 220 before any structures, electronic devices 300, soldering material, etc. are mounted and/or applied to the first and second substrates 210 and 220.

Where there may be one substrate 200, the substrate height may be approximated by an average height of the components (e.g., electronic devices 300) mounted, a median height of the components, a tallest height of the components, etc. Alternatively, a wall, lip, or dam may be provided along an outer edge of the substrate 200, and the substrate height may be approximated by a height of the wall, lip or dam. Using such an approximation, the estimation for volume V may assume that the underfill 502 does not flow to a height above this wall. The wall or lip may be configured to prevent underfill 502 from spilling over the edges of the substrate 200. Embodiments disclosed herein are not limited to this specific approximation of volume V or of the substrate height. Underfill 502 may adhere to a dam and drip, and so embodiments disclosed herein may omit a dam.

The distance D may broadly refer to a lateral distance between an edge or side of the electronic device 300 and an edge or side of a next (or adjacent) structure or component mounted on the first and second substrates 210 and 220, which are shown to be in the xy-plane of FIG. 2. In electronic circuit assemblies 100 using silicon carbide (SiC) dies as the electronic devices 300, the distance D between adjacent components (e.g., adjacent electronic devices 300) may be, for example, as low as 0.5 mm (or even lower, for example 0.1 mm) and up to a distance allowed by dimensions of the substrate 200. For example, the distance D may be in a range of 0.1 mm-3 mm, 0.5 mm-2 mm, or in a range of 1 mm to 2.5 mm.

Because increasing surface tension can enhance capillary action, capillary action of the underfill 502 at the sides of the electronic devices 300 may be enhanced by using a thicker material such as aluminum nitride (AlN) (which could be about 0.635 mm thick) for the first and second substrates 210 and 220. However, smaller substrates and dies may be required for compact applications or to comply with hi-pot testing requirements, such as in an inverter power switch system for an electrically-powered vehicle.

For example, silicon nitride ($Si_3N_4$) substrates may have a relatively thin thickness (e.g., about 0.32 mm) and may not similarly increase surface tension. If silicon nitride ($Si_3N_4$) is used for the first and second substrates 210 and 220, the first and second substrates 210 and 220 may be about half as thick (e.g., about 0.32 mm) as compared to the case using AlN and may not similarly increase surface tension. Although a space in the z-direction (or thickness direction) when the first and second substrates 210 and 220 are AlN substrates may be similarly sized as when the first and second substrates 210 and 220 are $Si_3N_4$ substrates, lateral distances in the xy-plane between electronic devices 300 may be greater when the first and second substrates 210 and 220 are $Si_3N_4$ substrates. In addition, silicon carbide (SiC) electronic devices 300 tend to be smaller and thinner (e.g., about 0.18 mm or 180 micron), leaving wider spaces between them on the substrate 200. Silicon (Si) diodes or transistors may be even thinner (e.g., about 0.07 mm or 70 micron). Conductor traces and other, circuitry components may require a certain spacing between electronic devices 300 and/or other components, which may cause a wider gap than desired between those adjacent components.

Figure 3B:
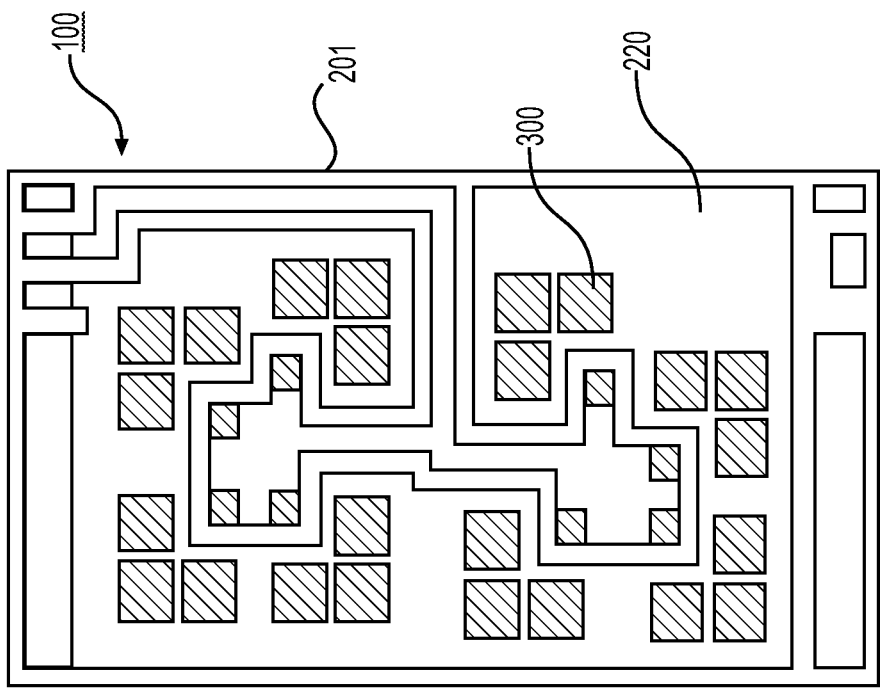
FIG. 3B depicts a plan view of an electronic circuit assembly showing a location of a conductor trace according to an embodiment.
Figure 3A:
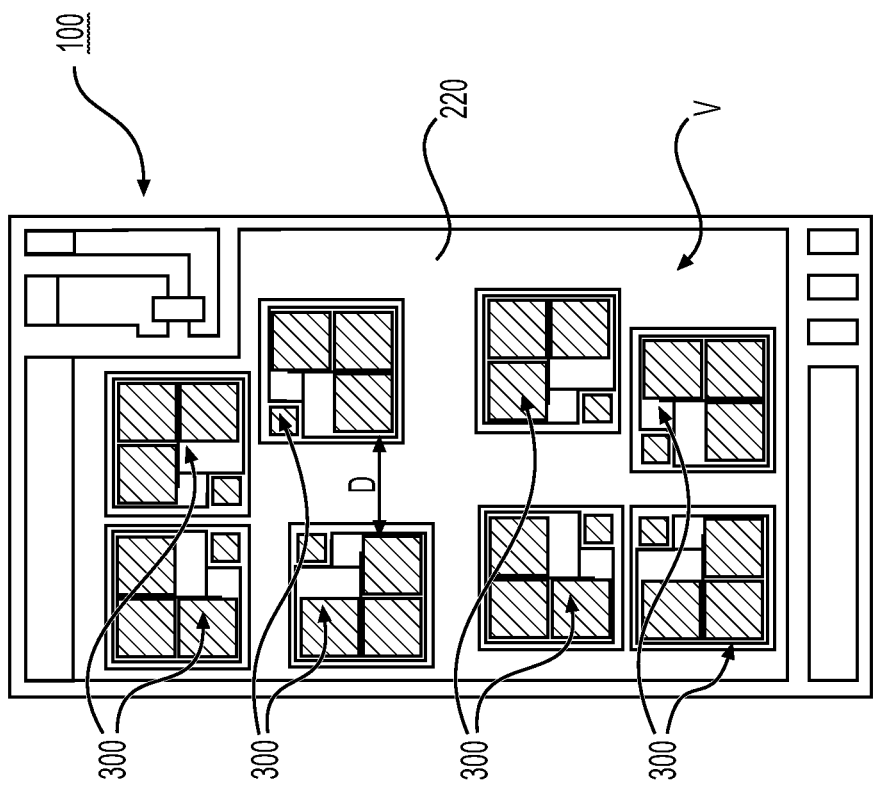
FIG. 3A depicts a view of an electronic circuit assembly showing locations of silicon carbide dies according to an embodiment.

FIG. 3A depicts relative positions of the electronic devices 300, and FIG. 3B depicts a relative position of a conductive track 201 connecting the electronic devices 300. The conductive track 201 may be provided in the second substrate 220, but alternatively or in addition thereto may be provided in the first substrate 210. FIGS. 3A and 3B show an example where the conductive track 201 is in the second substrate 220.

Electronic devices 300 implemented as SiC dies may be smaller (e.g., 4-7 mm length×4-7 mm width in the xy-plane, 5-6 mm length×5-6 mm width in the xy-plane, or 4.47 mm×4.47 mm, or 7 mm×7 mm), creating larger distances D (e.g., about 2 mm) between adjacent electronic devices 300 and/or between electronic devices 300 and other components or structures mounted on the substrate 200. For example, the electronic device 300 may be an SiC die which is 5×5 mm, 5.1 mm, or 5.25×5.25 mm. Furthermore, one or more conductive traces 201 embedded in and/or soldered to the second substrate 220 to connect the electronic devices 300 may determine positions of the electronic devices 300 and thus require a certain amount of space between adjacent electronic devices 300. These larger distances D may implicate a larger volume V to be filled by the underfill 502, and these layouts shown in FIGS. 3A and 3B may cause large air pockets during an underfilling process and spilling over of the underfill 502. In particular, layouts with conductive traces 201 may have larger, open areas, and thus a larger volume, in a middle section of the second substrate 220, which can cause a relatively large air pocket.

Aspects of the present disclosure may reduce air pockets by mounting a structure (e.g., spacer) in empty spaces on the first and second substrates 210 and 220 to occupy a volume V that would otherwise be occupied by the underfill 502, thus reducing an amount of air that must be removed by vacuum de-airing. Aspects of the present disclosure may further enhance capillary action of the underfill 502, or at least not interfere with a flow of the underfill 502, by mounting the spacer at positions that effectively narrow the spaces between electronic devices 300, between electronic devices 300 and an edge of the first and second substrates 210 and 220, and/or between electronic devices 300 and other components mounted on the first and second substrates 210 and 220. The spacers may be mounted at positions where there may be larger empty spaces between adjacent electronic devices 300 and at positions that do not affect or interfere with electrical performance. These aspects of the present disclosure can be used with thinner (e.g., $Si_3N_4$) substrates, smaller electronic devices 300, and circuit layouts such as those in FIGS. 3A and 3B that might require larger distances D between electronic devices 300, edges of the first and second substrates 210 and 220, and/or other components.

By reducing air gaps and spillage, aspects of the present disclosure may result in a smoother outer surface for electronic circuit assemblies 100 and/or a more uniform surface for coating. Aspects of the present disclosure may reduce or eliminate time spent removing excess underfill 502 cured on outer surfaces of the electronic devices 300, the first and second substrates 210 and 220, and/or other structures in the electronic circuit assembly 100, and/or reduce or eliminate electronic circuit assemblies 100 rendered unusable due to excess underfill 502.

Figure 4A:
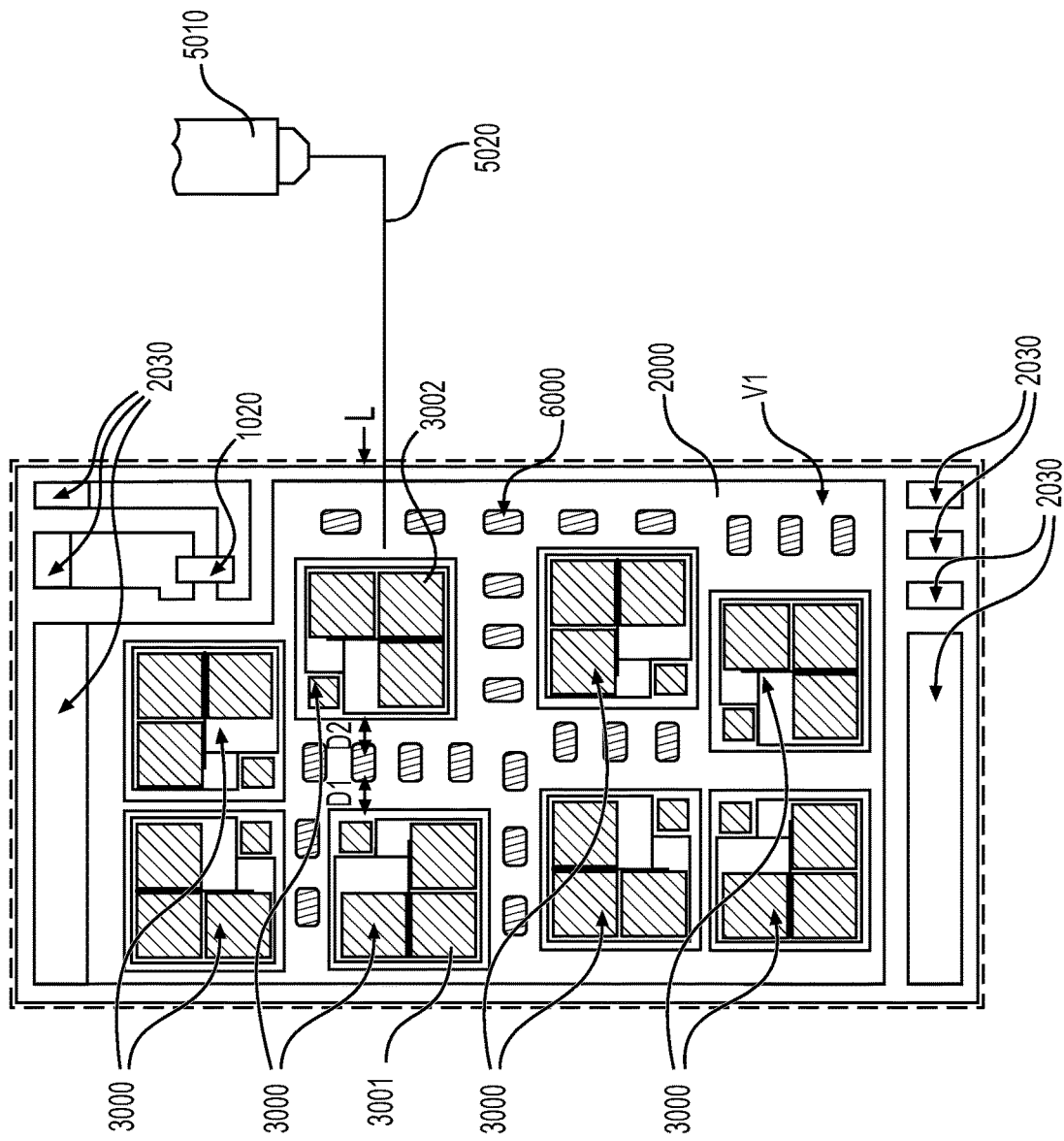
FIG. 4A depicts a plan view of an electronic circuit assembly before underfilling according to an exemplary embodiment.

FIG. 4A depicts an inner side of a substrate of an electronic circuit assembly 1000 before underfilling according to an exemplary embodiment. The electronic circuit assembly 1000 may include at least one substrate 2000 and at least one electronic device 3000 mounted (e.g., soldered) on the substrate 2000. The at least one substrate 2000 may include solder pads 2030 to couple with the electronic device 3000 and/or any lead frames (such as lead frames 250 and 260 in FIG. 1C). The electronic device 3000 may include lead pads and/or solder bumps or joints 4000 (FIG. 5) configured to connect to the solder pads 2030, but embodiments disclosed herein are not limited to such a coupling structure. In addition, electronic circuit assembly 1000 may include other circuitry or devices 1020 such as a thermistor.

FIG. 4A shows an example where multiple electronic devices 3000 are mounted on the substrate 2000 and spaced apart in the xy-plane, but embodiments disclosed herein are not limited. Each electronic device 3000 may be or include one or more dies (e.g., a silicon carbide or SiC die) configured to connect to each other. The electronic devices 3000 may be connected via a conductive trace embedded in and/or soldered on the substrate 2000.

Once the electronic devices 3000 are mounted on the substrate 2000, an underfill dispenser 5010 may dispense underfill 5020 at an edge or side of the substrate 2000. Alternatively, the underfill dispenser 5010 may dispense underfill 5020 at an edge of the electronic device 3000. The underfill 5020, which may be liquid, may be pulled across the substrate 2000 by capillary forces from the substrate 2000 and electronic devices 3000. Dotted line L may define a desired boundary for the underfill 5020. The underfill 5020 may be heated (for example, by heating the substrate 2000 slightly above room temperature) to assist flow. Before the underfill 5020 is dispensed, a vacuum condition may also be applied to the spaces between the substrate 2000 and electronic devices 3000 to assist flow.

After the underfill 5020 has flowed across the substrate 2000, a vacuum condition may be applied during a vacuum de-airing process to remove trapped air in the underfill 5020. The underfill 5020 may be cured and hardened to create a CTE intermediary between the electronic devices 3000 and the substrate 2000, add rigidity to the electronic circuit assembly 1000, and secure the electronic devices 3000 on the substrate 2000.

Due to wider distances D (FIG. 3A) in the xy-plane between adjacent components or structures (e.g., between adjacent electronic devices 3000, between an electronic device 3000 and another device 1020, and/or an electronic device 3000 and an edge of the substrate 2000), capillary forces on the underfill 5020 may not be as strong. In addition, a larger volume V of underfill 5020 may be needed to fill in these wider distances D, which may increase a number of air pockets formed in the underfill 5020. These air pockets may cause, during a vacuum de-airing process, the underfill 5020 to spill over and/or collect (and ultimately cure) on outer surfaces of the electronic devices 3000, which may create an excess of underfill 5020 that renders the electronic circuit assembly 1000 unsuitable for use and which may necessitate repeating the manufacturing process. Although distance D is illustrated as between two electronic devices 3000, one of ordinary skill in the art will appreciate that the distance D creating open spaces on the substrate 2000 may be between other components or structures, such as between the electronic device 3000 and the device 1020, between the electronic device 3000 and an edge of the substrate 2000, etc.

To reduce air gaps and spillage, one or more spacers 6000 may be mounted (e.g., soldered) onto the substrate 2000 at positions within these distances D (i.e., between adjacent electronic devices 3000, between an electronic device 3000 and another device 1020, and/or between the electronic devices 3000 and the edge of the substrate 2000). An arrangement of these spacers 6000 may be configured such that these spacers 6000 occupy volume in the electronic circuit assembly 1000, which may reduce an available area for air pockets to form, a volume of underfill 5020 used that would lead to air pockets, and a volume of air available to be trapped in the air pockets. In addition, an arrangement of these spacers 6000 may be configured to effectively reduce widths of open lateral spaces in the xy-plane, creating narrower spaces that enhance capillary action of the underfill 5020.

In reducing air pockets, underfill 5020 may be less likely to spill or boil over outer surfaces of the electronic devices 3000, substrate 2000, other devices 1020, and any other structures or components mounted on the substrate 2000 during a vacuum de-airing process. With less spillage, less underfill 5020 may be cured to these outer surfaces that would degrade or destroy a quality of the electronic circuit assembly 1000.

In reducing air pockets, an arrangement of the spacers 6000 may help create a smooth surface for the electronic circuit assembly 100 and thus enhance a quality reduce or eliminate time removing excess underfill 5020, and/or reduce or eliminate a possibility that the excess underfill 5020 renders the electronic circuit assembly 100 unusable for its intended application, reducing a number of discarded components and thus reducing a manufacturing yield loss and increasing a manufacturing efficiency. As an example, the electronic circuit assembly 1000 may be coated for use in certain applications, and reducing air pockets may help create a smooth surface which would facilitate a coating process and/or reduce time removing excess underfill 5020 before coating, making the coating process faster and/or less expensive. However, embodiments disclosed herein are not limited to coating applications.

Instead of travelling through a space having a width defined by distance D (exemplified as between electronic devices 3000 in FIG. 3A), the underfill 5020 may instead travel through a space having a width defined by a smaller distance D1 between an electronic device 3000 and a spacer 6000. A size and shape of the spacers 6000, along with an arrangement of the spacers 6000, may be configured such that D1 is in a range of 10-90% of D depending on a placement, but embodiments disclosed herein are not limited. For example, if the spacer 6000 is placed at a midpoint of D, then D1 may be at least 50% less than d. D1 may be 17-38% of D or 15-40% of d. A width of the spacer 6000 may further decrease this distance D1. However, if the spacer 6000 is positioned closer to one electronic device 3000 and further from another electronic device 3000, distance D1 to the further electronic device 3000 may be less than 50%, while a distance to the closer electronic device 3000 may be greater than 50%. The distance D1 may be, for example, in a range of 20-80% of D, 30-70% of D, or 40-60% of d. If a width of the spacer 6000 is about ⅓ of D and placed at a center of D, then D1 may be ⅓ of d. Other examples are described below in more detail.

An exemplary arrangement may include multiple spacers 6000 aligned along a path that intersects midpoints between adjacent electronic devices 3000. If the spacers 6000 are asymmetrical or rectangular, the spacers 6000 may be oriented such that a longer side of the spacers 6000 extends in a direction between adjacent electronic devices 3000 to further reduce the distances D1 between the electronic devices 3000 and the spacers 6000. However, embodiments disclosed herein are not limited to a particular arrangement or shape of spacers 6000. For example, the spacers 6000 may be cylindrical, cubic, etc. In addition, the spacers 6000 may not be aligned at midpoints.

Figure 4B:
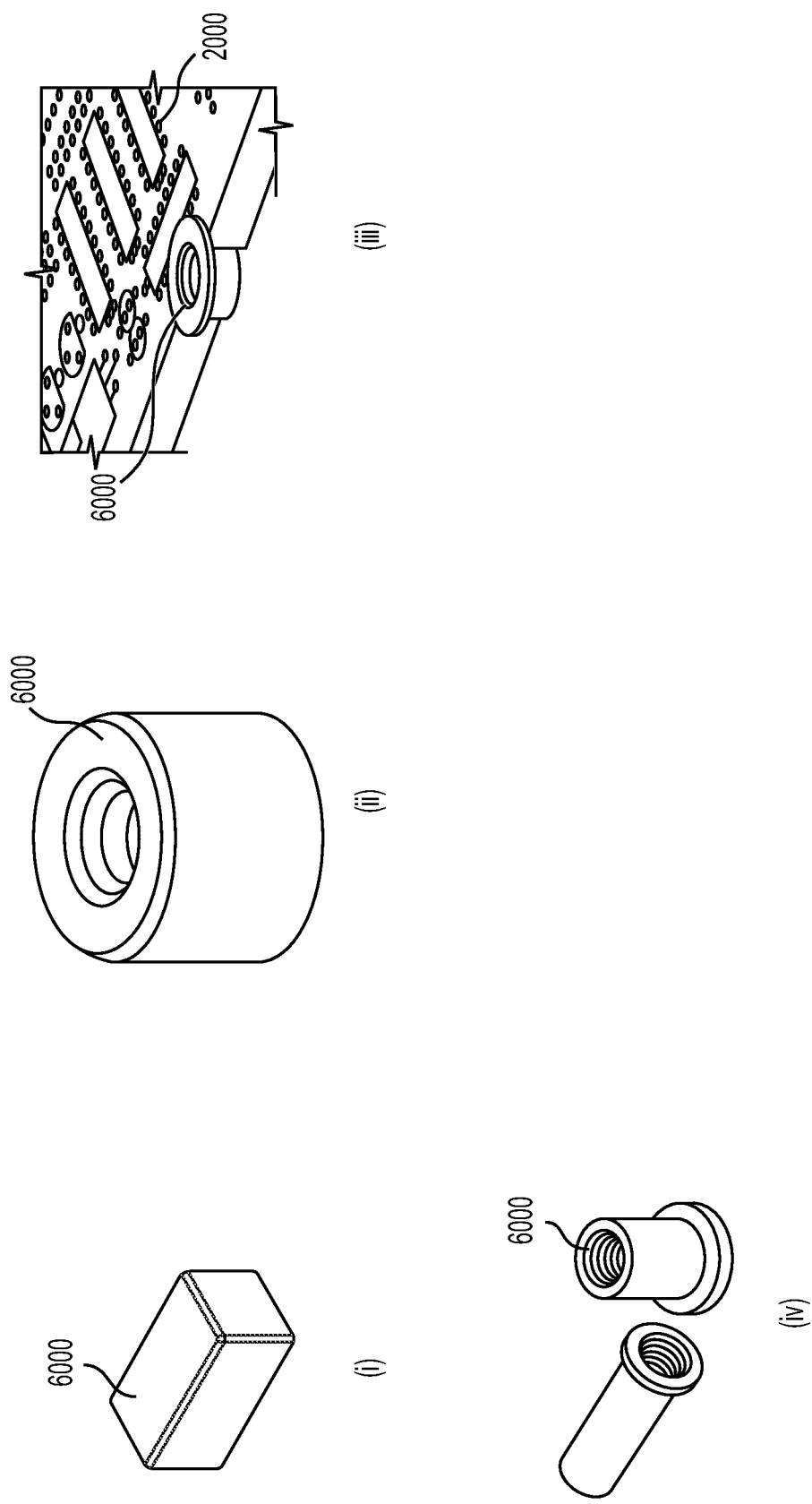
FIG. 4B depicts exemplary spacers which may be used in the electronic circuit assembly of FIG. 4A.

FIG. 4B depicts exemplary spacers which may be used in the electronic circuit assembly 1000 of FIG. 4A. For example, in view (i), the spacer 6000 may be cubic with a rectangular or square cross-section. For example, the spacer 6000 may be a rectangular cuboid or a right rectangular prism. In view (ii), the spacer 6000 may be cylindrical, and may include a through hole. However, a through hole is not required, as the spacer 6000 may not be used to couple two structures together but rather to fill up empty space. In view (iii), the spacer 6000 may be threaded through the substrate 2000 to be mounted. In such a case, a height of the spacer 6000 may be reduced by a thickness of the substrate 2000. View (iv) depicts a threadable spacer before being inserted through the substrate 2000. A top portion of the spacer 6000 may have a larger diameter than a remaining portion of the spacer 6000 so as to restrain further insertion. Alternatively, the spacer 6000 of view (iv) may be soldered to the substrate. The top portion having the larger diameter may provide a soldering joint.

Referring back to FIG. 4A, instead of travelling through a wide space having a large volume V (exemplified in FIG. 3A), the underfill 5020 may instead travel through a space having a smaller volume V1 within the bounds of the at least one substrate 2000 and between electronic devices 3000, other devices 1020, and spacers 6000. The spacers 6000 may be configured to occupy a certain volume of empty space occurring between adjacent components, thereby reducing V (FIG. 3A) to V1 (FIG. 4A). For example, a volume of the spacers 6000 may be configured such that volume V1 is at least 10-20% less than volume V (e.g., volume V1 may be 10-90% less than volume V), but embodiments disclosed herein are not limited. For example, the spacers 6000 may be configured such that volume V1 is 20-80% less than volume V, 30-70% less than V, half of V, ⅓ of V, etc. V1 may equal to, for example 0.75V, 0.5V, 0.7V, ⅔ of V, ⅓ of V, etc.

Figure 5:
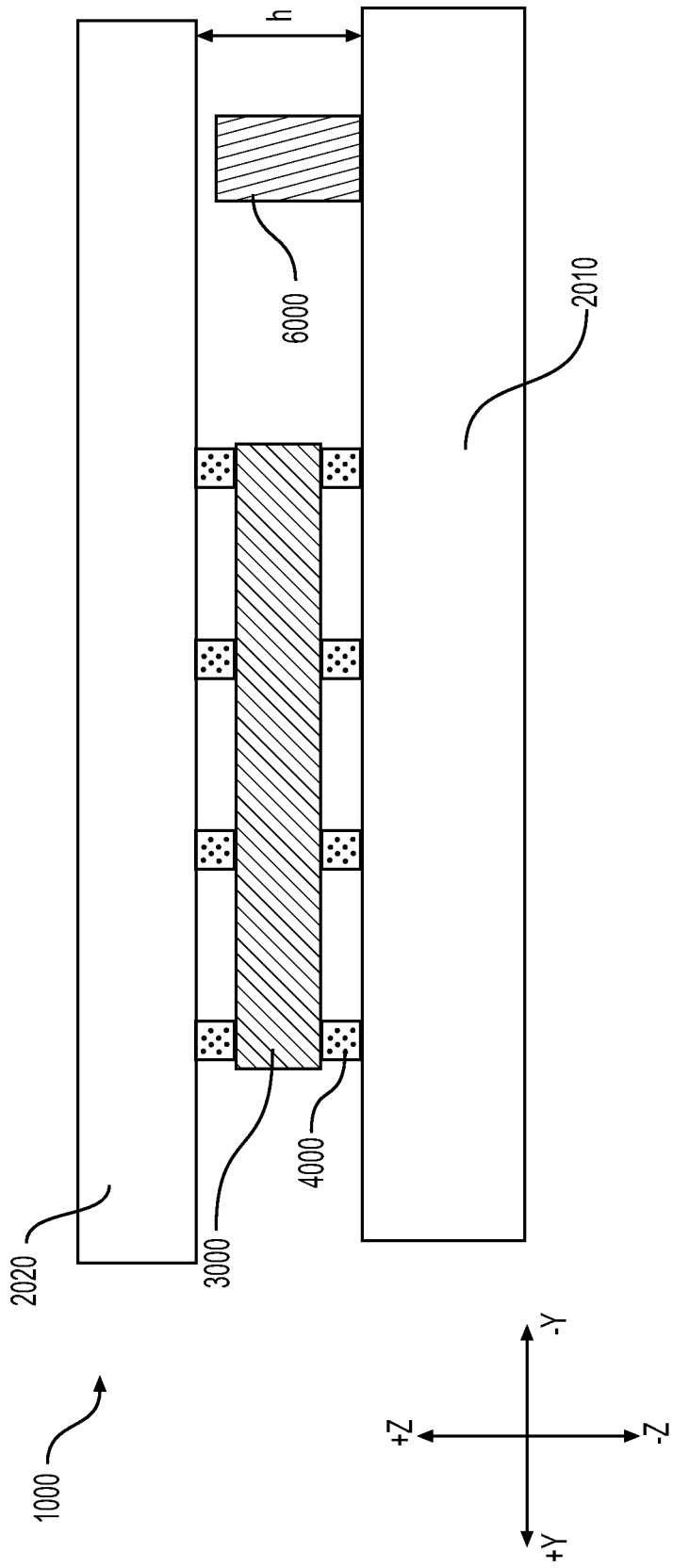
FIG. 5 depicts a side of an electronic circuit assembly before underfilling according to an exemplary embodiment.

FIG. 5 depicts a side view of the electronic circuit assembly 1000. The at least one substrate 2000 (FIG. 4A) may include a first or base substrate 2010 and a second or cap substrate 2020. A volume estimated by an area of the substrate and a substrate height h may represent a first volume or an initial substrate volume. Here, the term "substrate height" may not refer to a thickness of the electronic circuit assembly 1000 and/or a height of the second substrate 2020, but the substrate height h may rather be defined by a distance between inner surfaces of the first and second substrates 2010 and 2020. Embodiments disclosed herein are not limited to a specific approximation of this initial substrate volume. For example, where underfilling occurs with just one base substrate 2000, the substrate height h may be defined by an average height of structures or components mounted on the substrate 2000, a median height of the mounted structures or components, a tallest height, a wall or dam along an outer edge of the substrate 2000, etc.

Although the term "initial substrate volume" is used to describe this volume, this volume is not a solid volume of the first and second substrates 2010 and 2020 (i.e., thicknesses of the first and second substrates 2010 and 2020 in the z-direction multiplied by its area in the xy-plane). Rather, this initial substrate volume represents an initial volume of empty space between the first and second substrates 2010 and 2020 before structures are mounted.

A total volume defined by a sum of volumes of each of the components or structures mounted on the substrate 2000 (e.g., electronic devices 3000) not including the spacers 6000 may be a second volume or device volume. The initial substrate volume minus the device volume may be a third volume or reference volume, which may approximately equal earlier volume V.

Each of the spacers 6000 may have a prescribed or predetermined volume, and a sum of the prescribed volumes of all spacers 6000 may equal a total spacer volume or fourth volume. The spacer volume may be predetermined based on predetermined dimensions of the spacers 6000 and a number of spacers 6000 mounted to the substrate 2000.

Volume V1 may be approximately the third (reference) volume (approximately V) minus the fourth (total spacer) volume. For volume V1 to equal approximately 0.9V, the total spacer volume may be approximately 0.1V. For volume V1 to equal approximately 0.75V, the total spacer volume may be approximately 0.25V. The spacers 6000 may fill at least 10% of the empty space or of the reference volume V. For example, the spacers 6000 may be configured to fill 10-12% of the empty space to be 0.10-0.12V, or alternatively may be configured to fill more (e.g., at least 25% of the reference volume V). In some embodiments, the spacers 6000 may fill at least half of the reference volume V, or three quarters of the reference volume V. The spacers 6000 may both fill up empty space and also be configured to change a flow pattern of the underfill 5020 so that less quantity of air pockets (and/or smaller sized air pockets) are trapped as compared to the case without spacers 6000.

The spacers 6000 may have a conductive surface configured to be soldered (or alternatively, sintered) to the first and/or second substrates 2010 and/or 2020. Although FIG. 5 shows the spacer 6000 mounted on the first substrate 2010, the spacer 6000 may alternatively be mounted on the second substrate 2020, or alternatively both substrates 2010 and 2020. For convenience of description, an example where the spacer 6000 is mounted to the first substrate 2010 is described.

For example, the spacers 6000 may be made of a material similar to a material of the first and second substrates 2010 and 2020 (e.g., fiberglass or silicon-based), a polymer, or a ceramic, and then coated in a metal material such as tin, steel, or copper. Alternatively, the spacers 6000 may be made of solid metal (copper, steel, aluminum, etc.). In such a case, the metal may be a lower cost metal material. As an example, the spacers 6000 may be solid copper, tin-plated copper, or an aluminum oxide ($Al_2O_3$) ceramic. A material and position of the spacers 6000 may be configured to not interfere with an electrical connection between the electronic devices 3000, any conductive traces, etc. In some embodiments, the presence of spacers 6000 does not interfere with an electrical connection between the electronic devices 3000, any conductive traces, etc.

The spacers 6000 may be, for example, surface-mount technology (SMT) spacers configured to be mounted directly on the first substrate 2010. SMT spacers may conform to standards set by the Joint Electron Device Engineering Council (JEDEC) or the Institute for Printed Circuits (IPC). SMT spacers may be mass-produced in standard sizes (e.g., the "0201" package or the "01005" package) and standard materials, such as steel. SMT spacers may be used to space multiple substrates or dies apart from each other (e.g., in the z-direction) or to mount a substrate to another structure (e.g., a housing or case). Some spacers may be threaded to facilitate screw or push tab coupling between a substrate and another structure. In addition, some spacers may be configured to be screwed through a through-hole of a substrate instead of soldered on.

In some embodiments, spacers 6000 possess no other function in an operation of the electronic circuit assembly 1000 and/or in a system where the electronic circuit assembly 1000 is installed (inverter system, heat sink system, electrically-powered vehicle, etc.) other than to fill space during manufacturing and/or enhance capillary flow of the underfill 5020. Spacers 6000 may be mounted only on non-conductive (or less conductive) areas or regions of the first substrate 2010, only on dielectric (or more insulating) materials or areas of the first substrate 2010, and/or only in areas that are unoccupied by other conductive or electrical components (conductive traces, circuit patterns, etc.). Spacers 6000 may be electrically connected to the first substrate 2010 and/or electronic devices 3000 (e.g., SiC dies) soldered onto the first substrate 2010. In such a case, the spacers 6000 may not be soldered to the second substrate 2020 and may not interfere with an operation of a circuit. Alternatively, spacers 6000 may not directly touch and/or may not be electrically connected to any conductive or electrical components on the substrate 2010. When the spacers 6000 are soldered onto the first substrate 2010, a soldering material may not directly touch or contact any conductive regions, conductive traces, circuit patterns, electronic devices, dies, etc. of the first substrate 2010.

The spacers 6000 may have a height in the z-direction that is similar to a height of the electronic device 3000 once mounted on the first substrate 2010. As an example, when there is just one substrate (e.g., first substrate 2010) the height of the electronic device 3000 may be at least 65% the height of the spacer 6000 or vice versa. When there are both first and second substrates 2010 and 2020, a height of the spacer 6000 may be less than a height of the electronic device 3000 and/or a distance between the first and second substrates 2010 and 2020. Preferably, the spacer 6000 may have a height which is equal to or slightly less than a height of the electronic device 3000. The electronic device 3000 may be a SiC die having a thickness (height) of 0.25 mm or less (e.g., approximately 0.18 mm) or an Si die having a thickness of 0.1 mm or less (e.g., approximately 0.07 mm), which may result in a similar height when mounted on the first and second substrates 2010 and 2020 with the solder joints 4000.

"Package 0201" SMT spacers may have a height of 0.25 mm with a footprint of 0.3 mm×0.6 mm. Here, "footprint" refers to the dimensions of the SMT spacer at a mounting position where the SMT spacer is mounted on the substrate 2000. These SMT spacers could be implemented for spacers 6000. However, when SiC dies are used, "Package 0201" spacers may be too tall. "Package 01005" SMT spacers may have a height in a range of 0.1 mm and 0.2 mm with a footprint of 0.4×0.2 mm and may be implemented for spacers 6000.

Preferably, a height of the spacers 6000 may be equal to a height of the electronic device 3000 to extend between the first and second substrates 2010 and 2020. In such a case, the spacer 6000 may be soldered to both the first and second substrates 2010 and 2020. A range of heights of these SMT spacers 6000 may be 0.012-1 mm, depending on manufacturing reliability and error. The spacers 6000 may have a larger height (e.g., up to 15 mm) in larger applications. For example, the spacers 6000 may have a height such as 0.3 mm, 0.89 mm, 1.6 mm, 1 mm, 1.5 mm, 2 mm, 2.3 mm, 2.54 mm, 3.2 mm, 4 mm, 5 mm, 6 mm, 6.4 mm, 7 mm, 8 mm, 9.5 mm, 10 mm, or 15 mm. Some spacers 6000 may have a larger height but be configured to be screwed or threaded through the first and/or second substrate 2010 and/or 2020, and so an effective height within the space between the first and second substrates 2010 and 2020 will be less than a manufacturing height (e.g., a spacer 6000 may have a manufacturing height of 1.5 mm, but once threaded through the first substrate 2010, may only protrude above the first substrate 2010 by 0.3 mm or less).

The spacers 6000 may have a height such as 0.18 mm or slightly less (e.g., 0.17 mm or 0.16 mm) to match a height of a SiC die. In addition, SiC dies may have smaller lengths and widths (in the x-direction and the y-direction) than other types of electronic devices (e.g., a length and width of approximately 5 mm, 5.1 mm, and 5.2 mm). Because SiC dies may be smaller than, for example, insulated-gate bipolar transistors (IGBT), there may be more open space between electronic devices 3000 implemented as SiC dies.

If a distance D between a first electronic device 3001 and a second, adjacent electronic device 3002 is approximately 2 mm, when a spacer 6000 is mounted therebetween, a distance D1 between the first electronic device 3001 and the spacer 6000 may be in a range of 0.1 mm to 1 mm, depending on an orientation, size, and position of the spacer 6000. Where the distance D is greater than 2 mm (e.g., 3 mm, 4 mm, etc.), D1 may be in a range of 0.1 to 2.9 mm depending on a placement. A distance D2 between the second electronic device 3002 and the spacer 6000 may also be in a range of 0.1 mm to 1 mm, but depending on a location of the spacer 6000, may not necessarily be equal to D1 (i.e., D1 and D2 may be different). The spacer 6000, however, may preferably be positioned at about a midpoint between the first and second electronic devices 3001 and 3002 such that distances D1 and D2 are approximately equal. Preferably, distances D1 and D2 may be 0.5 mm or less (e.g., 0.1 mm) though may be larger if there are constraints or issues.

Instead of travelling through a passage having a width of D, underfill 5020 may travel through a first narrower space having a width equal to distance D1 and a second narrower space having a width equal to distance D2. The spacer 6000 may be configured and positioned such that D1 is, for example, equal to a range of 30-80% of D (e.g., ⅓ or ½ of d) or, as another example, equal to a range of 17-38% of D, or 15-40% of D, or 10-45% of D. These narrower spaces may result in a smaller volume V1 through which underfill 5020 flows and occupies, and may further enhance capillary action of the underfill 5020. Although this example describes a space between a first electronic device 3001 and a second electronic device 3002, these spacers 6000 may also narrow spaces between a first electronic device 3001 and another device 1020 (e.g., thermistor), between a first electronic device 3001 and an edge of the substrate 2000, etc. Spacers 6000 may be placed wherever larger open spaces occur between the first and second substrates 2010 and 2020.

By placing a spacer 6000 between adjacent components on the first substrate 2010 (e.g., between adjacent electronic devices 3000), the passage for the underfill 5020 may be split into two, effectively reducing the width of the passage for the underfill 5020 by at least 50% when the spacer 6000 is placed halfway between the adjacent electronic devices 3000. Even where the spacers 6000 are oriented such that a relatively small length of the spacer 6000 extends between the electronic devices 3000, the effective width of the passage for the underfill 5020 may be substantially reduced.

The spacers 6000 may have a width in a range of 0.2 mm-2 mm (e.g., 0.2 mm, 0.3 mm, 0.6 mm, 0.89 mm, 1.6 mm, and 1.8 mm) and a length in a range of 0.4 mm-15 mm (e.g., 0.4 mm, 0.6 mm, 1.6 mm, 2.3 mm 2.54 mm, 5 mm, 7 mm, 10 mm, 14 mm, or 15 mm). For example, where adjacent electronic devices 3000 are spaced apart by 2 mm in the x-direction, and a length of the spacer 6000 in the x-direction is 0.3 mm and is placed at an approximate midpoint in the x-direction, the effective width of the passage created between the electronic devices 3000 for the underfill 5020 may be about 0.85 mm, which is roughly 42.5% of the original 2 mm path. Where the spacer 6000 is oriented such that a length of 0.6 mm extends in the x-direction, the effective width of the passage may be 0.7 mm, which is roughly 35% of the 2 mm path. Where the spacer 6000 is dimensioned and positioned such that the effective width of the passage for the underfill 5020 may be 0.5 mm, where the initial width was 2 mm (reflecting a distance between adjacent electronic devices 3000 without an intervening spacer 6000), these spacers 6000 have resulted in a 75% reduction in the width of the passage.

The footprint of the spacer 6000 may, for example, be 1.8 mm×5 mm. The spacer 6000 may be oriented between two electronic devices 3000 which are 2 mm apart such that its width in the x-direction is 1.8 mm and its length in the y-direction is 5 mm. In such a case, the effective path for the underfill 5020 between the spacer 6000 and one of the electronic devices 3000 is 0.1 mm, or 5% of the original 2 mm width.

The spacers 6000 may have a width, in the x-direction, of at least 15% of the distance D of the original path, but embodiments disclosed herein are not limited. The spacers 6000 may have a width of about ⅓ the distance D, rendering the widths of the two passages roughly ⅓ the distance D when the spacer 6000 is placed at a midpoint between the adjacent electronic devices 3000. In some embodiments, the spacers 6000 may have a width, in the x-direction, of 80-95% of the distance D (e.g., 90%).

The spacers 6000 may alternatively be cylindrical. In such a case, a diameter of the spacers 6000 may be similar to the above described widths or lengths. For example, the spacer 6000 may have a diameter in a range of 1 mm-3.3 mm (e.g., 1 mm, 2 mm, 2.25 mm, 2.5 mm, 2.7 mm, 3.3 mm, 5.6 mm, or 7.1 mm). Spacers 6000 may come in a variety of sizes and/or designed for specific applications, and embodiments disclosed herein are not limited to the listed exemplary sizes of spacers 6000.

Spacers 6000 may also be placed between electronic devices 3000 and an adjacent edge of the substrate 2000 to reduce spillage of the underfill 5020 over the edge of the substrate 2000. Distances between the electronic device 3000 and the spacer 6000, in addition to distances between the spacer 6000 and the edges of the first and second substrates 2010 and 2020, may be similar to distances D1 and D2. Similarly, spacers 6000 may be placed between an electronic device 3000 and another device 1020. Distances between the electronic device 3000 and the spacer 6000 and between the spacer 6000 and the device 1020 may be similar to distances D1 and D2.

An advantage of using spacers 6000 sized to industry standards is that no customized hardware may be required to implement aspects of the present disclosure. Methods of the present disclosure may be implemented in circuit designs that use preexisting hardware, machinery, and flip-chip layouts to reduce air pockets, reduce spillage, and/or enhance capillary action in those circuit designs. Alternatively or in addition thereto, the spacers 6000 could be customized to better narrow the spaces between electronic devices 3000, to better avoid gaps between adjacent spacers 6000, and to better reduce a volume occupied by the underfill 5020. For example, longer spacers (e.g., in a −y direction in FIG. 4A) may be manufactured and positioned between adjacent columns of electronic devices 3000 to reduce open space through which the underfill 5020 flows. As another example, spacers 6000 may be formed to have an "L" shape to surround two sides of an electronic device 3000, or a "t" or cross shape to extend along two sides each of four electronic devices 3000.

Figure 6A:
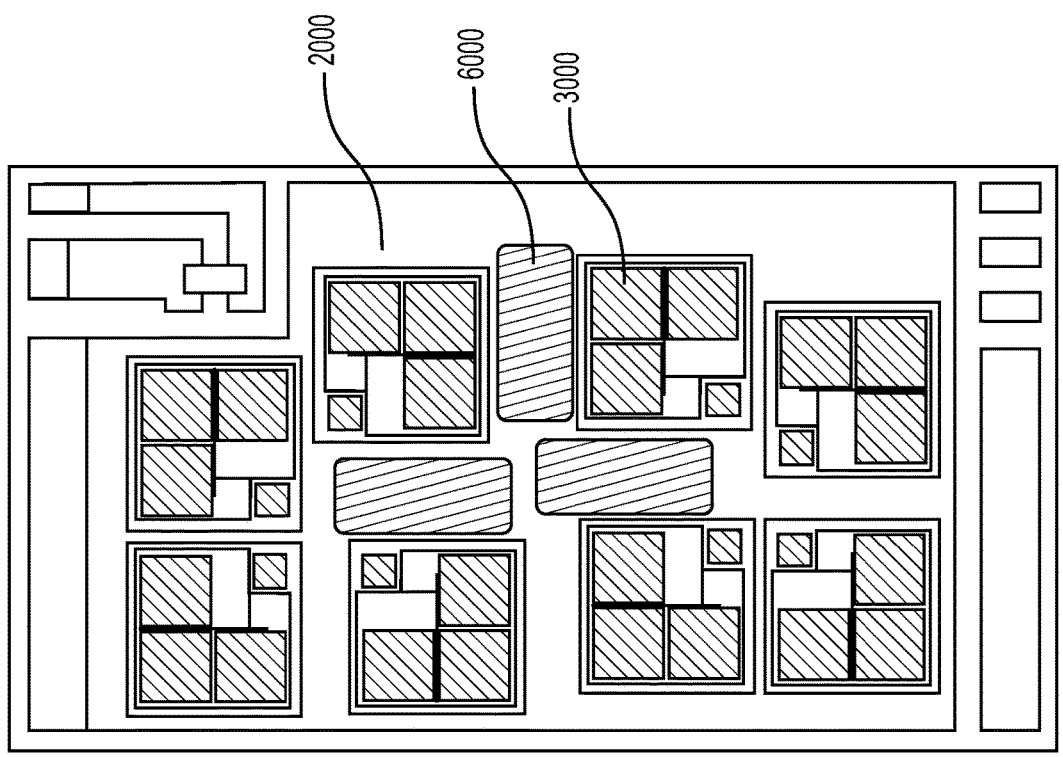
FIG. 6A depicts a view of an inner side of a substrate of an electronic circuit assembly according to another exemplary embodiment.
Figure 6B:
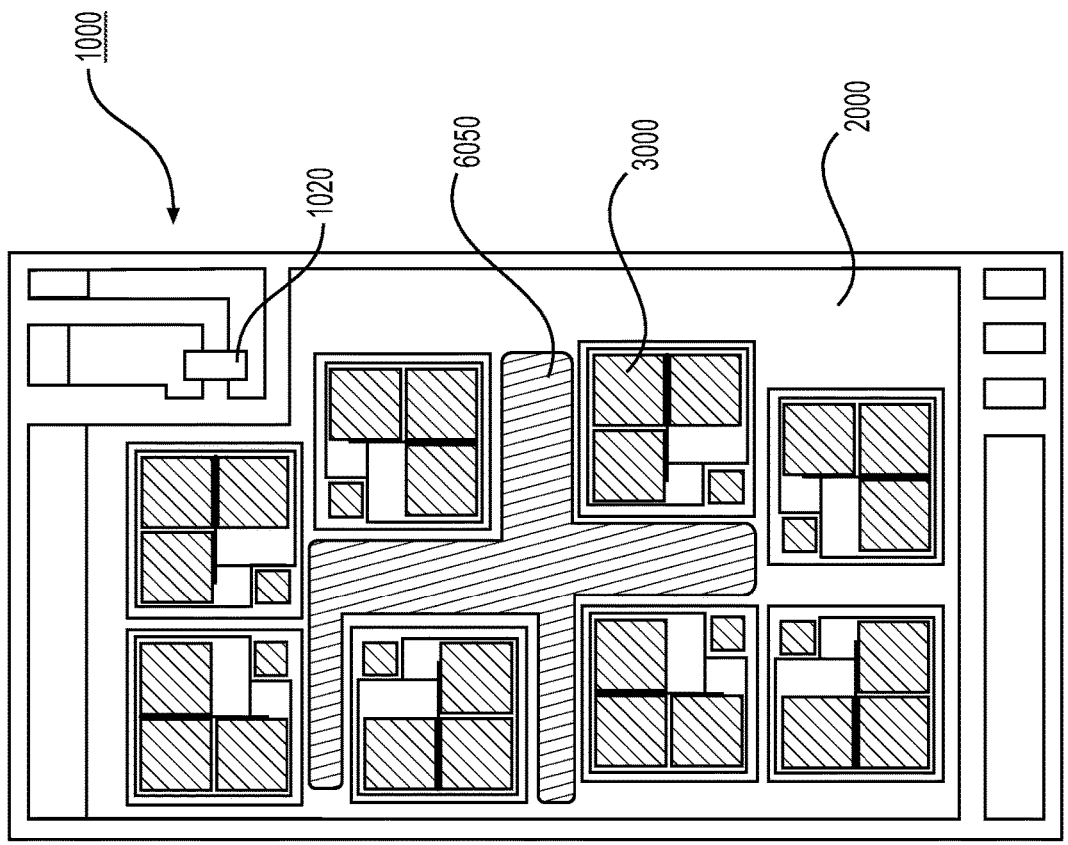
FIG. 6B depicts a view of an inner side of a substrate of an electronic circuit assembly before underfilling according to another exemplary embodiment.

FIG. 6A depicts a view of an inner side of a substrate of the electronic circuit assembly according to another exemplary embodiment, and FIG. 6B depicts a view of an inner side of a substrate of the electronic circuit assembly according to yet another exemplary embodiment. The embodiment of FIG. 6A may include larger spacers 6000 which have lengths that are longer than lengths of the electronic devices 3000. Less spacers 6000 may be required to fill an empty volume of space and reduce distances between the electronic devices 3000. These spacers 6000 may be customized based on a layout of the electronic devices 3000, other devices 1020, any conductor traces, etc. Alternatively, these spacers 6000 may be readily available standards that are sized according to industry packages that have longer dimensions. These spacers 6000, for example, have a footprint of 1.6× 2.54 mm or 1.6×2.3 mm, but embodiments disclosed herein are not limited.

The embodiment of FIG. 6B may primarily differ from that of FIG. 4A in its use of spacer 6050. Here, the spacer 6050 may not necessarily be an SMT spacer sized to industry sizes or packages, but rather configured based on the layout of electronic devices 3000, other devices 1020, any conductor traces, etc. on the at least one substrate 2000.

As shown in FIG. 6B, the spacer 6050 may be designed to fill a central open area between electronic devices 3000, so a plurality of spacers 6000 may not be required to fill that central open area. A space between the electronic devices 3000 and the spacer 6050 may be 0.5 mm, but embodiments disclosed herein are not limited. Less underfill 5020 may be required, as spacer 6050 may occupy a large volume. Because there may be less air volume and gaps between spacer 6050 and surrounding components, there may be less air trapped in air pockets during the underfill process and less spillage. In addition, when the underfill 5020 is dispensed, capillary action between the electronic devices 3000 and the spacer 6050 may be enhanced, as there may be a long, narrow space through which the underfill 5020 can flow. However, an advantage of standard SMT spacers is that they may be easily mass produced and available off a reel, making automated assembly easy. Here, customized spacers 6050 may be harder to manufacture with existing machinery and may have to be manually placed on the substrate 2000.

Figure 7:
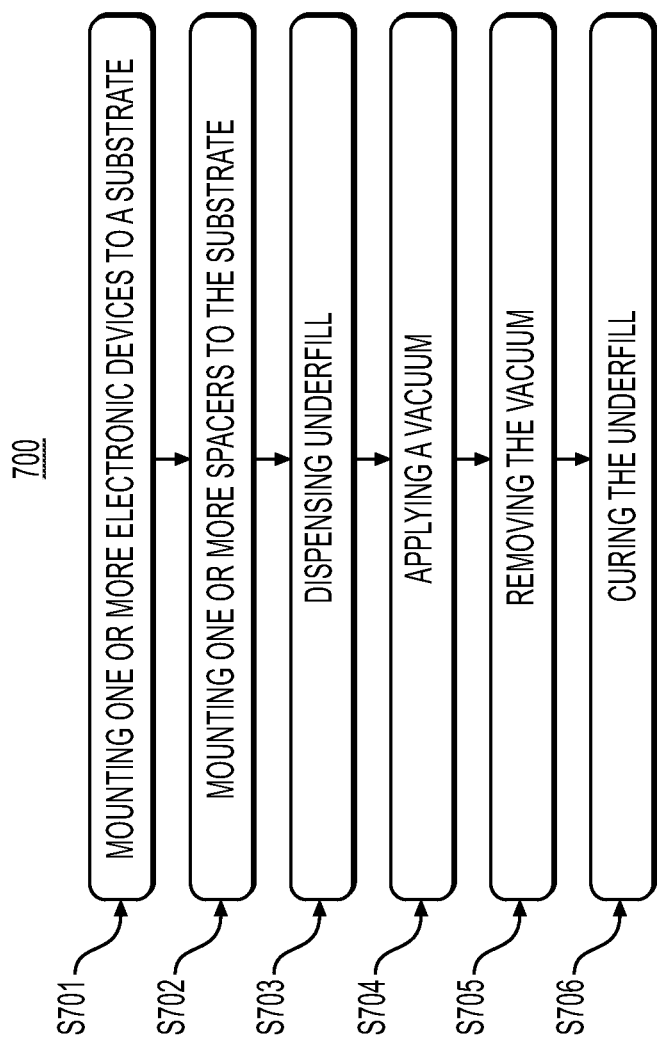
FIG. 7 is a flow chart depicting an underfill method using spacers according to an exemplary embodiment.

FIG. 7 is a flow chart depicting an underfill method according to an exemplary embodiment. Although a vacuum de-airing process is described, embodiments disclosed herein can be used for other underfill processes where capillary forces act on a liquid underfill and/or where liquid underfill fills an empty volume of space.

Referring to FIGS. 1-7, an underfilling method 700 may include, in step S701, mounting one or more electronic devices 3000 to at least one substrate 2000. The electronic devices 3000 may, for example, be or include SiC dies mounted between a first substrate 2010 and a second substrate 2020. A bottom of the SiC dies may have solder bumps or joints that are soldered onto corresponding solder pads on the substrate 2000. Soldering may occur with, for example, a solder reflow process involving a solder paste and heating the substrate 2000 to melt the solder paste. As another example, soldering may occur with a soldering iron. As another example, the electronic devices 3000 may be mounted using a sintering method. Embodiments disclosed herein are not limited to mounting methods or in the context of SiC dies, though may be helpful in the context of smaller SiC dies and thinner $Si_3N_4$ substrates. Before the electronic devices 3000 are mounted on the substrate 2000, a flux may be dispensed to break down oxides and facilitate a soldering connection between the electronic devices 3000 and the substrate 2000.

After mounting the electronic devices 3000 (or alternatively, after mounting the spacers 6000 in step S702 described in the next paragraph), flux may be cleaned, such as with a solvent spray. Flux dispensing and/or flux cleansing are not required, however, and embodiments disclosed herein are not limited to a particular use of flux in assembling electronic circuit assemblies.

In step S702, the method 700 may include mounting one or more spacers 6000 and/or 6050 to the substrate 2000. As an example, a plurality of spacers 6000 may be used. The plurality of spacers 6000 may be metal SMT spacers having a thickness (height) of 0.18 mm or 0.20 mm and a diameter of between 1 mm to 2 mm, but embodiments disclosed herein are not limited. For example, the spacers 6000 may be "package 01005" spacers.

The spacers 6000 may be automatically mounted (e.g., from a reel) and soldered onto the substrate 2000 at prescribed or predetermined positions with respect to the electronic devices 3000, any other devices 1020, and an edge of the substrate 2000. In the case of a solder reflow process, the electronic devices 3000 and the spacers 6000 may be mounted with a soldering paste, and then ambient air and/or the substrate 2000 may be heated to melt the soldering paste and secure the mountings. As with the electronic devices 3000, embodiments disclosed herein are not limited to mounting methods of the spacers 6000. As an alternative to automatic placement of the spacers 6000, the spacers 6000 may be manually placed at the prescribed positions. As an alternative to metal spacers 6000, the spacers 6000 may be made of a plastic or resin material, which may be coated in a metal material for soldering or alternatively screwed or pressed-fit into a through hole in the substrate 2000.

An arrangement of the spacers 6000 may be configured to fill up empty space, reduce a volume to be occupied by the underfill 5020, and/or to provide narrow spaces through which underfill 5020 may flow after dispensing (in step S704, described later). The spacers 6000 may be provided between adjacent components or structures mounted on the substrate 2000. Merely for convenience of description, an example where spacers 6000 are mounted between adjacent electronic devices 3000 is described. The spacers 6000 may be provided between adjacent electronic devices 3000 so that, instead of a passage for the underfill 5020 having a width equal to distance D between adjacent electronic devices 3000, the passage for the underfill 5020 may be split into two or more passages having smaller widths equal to D1 and/or D2, which may be less than half the distance D due to a width occupied by the spacer 6000. The width of the passage for the underfill 5020 at a portion between electronic devices 3000 may be effectively reduced by 50% or more (e.g., 60%-75% when "0201" package SMT spacers are used between dies placed about 2 mm apart).

The method 700 may include step S703 of dispensing the underfill 5020, which may be in liquid form. The method 700 may further include step S704 of applying a vacuum to de-air the underfill 5020 to remove trapped air.

In step S703, where the at least one substrate 2000 is oriented horizontally, a vacuum condition may be applied before dispensing the underfill 5020 and/or as the underfill 5020 is dispensed. In the case where the at least one substrate 2000 is oriented vertically (as exemplified in FIG. 1B), applying a vacuum in step S703 may cause the underfill 5020 to drip to an opposite side of the substrate 2000, and so applying a vacuum at this step S703 may be omitted.

In the case where a vacuum is applied during the dispensing step S703, the electronic circuit assembly 1000 and the underfill dispenser 5010 may be placed in a vacuum chamber, which is sealed, before the underfill 5020 is dispensed. Then, the underfill 5020 may be dispensed (e.g., using a dispensing needle or other dispenser designed for low pressure conditions). In this case, the underfill dispenser 5010 may be inside the vacuum chamber. As another example, the underfill dispenser 5010 may initially dispense underfill 5020 at an edge of the substrate 2000 but at such a position where the underfill 5020 might not yet be compelled to flow across the substrate 2000. Then, the electronic circuit assembly 1000 including the dispensed underfill 5020 may be placed in a vacuum chamber, which is sealed. An evacuation of the vacuum chamber (and/or heating) may initiate a flow of underfill 5020, which may then be assisted by capillary forces once the underfill 5020 flows closer to the space between the electronic device 3000 and the spacer 6000. Embodiments disclosed herein are not limited to any particular methods for applying vacuums in step S703 and/or step S704. In addition, embodiments disclosed herein are not limited to any dispensing machinery used in step S703.

In Step S703, whether a vacuum is applied, the underfill 5020 may be dispensed to the substrate 2000 at a position adjacent to an edge of the substrate 2000. Alternatively, in a horizontal orientation with just one substrate 2000, the underfill 5020 may be dispensed at a position adjacent to the electronic device 3000. The position where the underfill 5020 is dispensed may be configured to guide the flow of underfill 5020 between the electronic device 3000 and the spacer 6000. For example, the underfill 5020 may be dispensed at an edge of the substrate 2000 at a position that aligns, in an x-direction or a y-direction, with an edge of one electronic device 3000. The underfill 5020 may flow across the substrate 2000 through the narrow spaces between the electronic devices 3000 and the spacers 6000. Although this flow may, in some embodiments using a horizontal orientation, be assisted by the vacuum condition, because spacers 6000 have been added, capillary action assisting the flow of the underfill 5020 may also be enhanced. In addition, because the spacers 6000 fill up a volume of empty space, there may be less likelihood of air pockets.

While the underfill 5020 is flowing across the substrate 2000, ambient air around the electronic circuit assembly 1 and/or the substrate 2000 may be heated to further assist with the flow of the underfill 5020. The heating process may be configured to heat the underfill 5020 to a temperature higher than room temperature, but less than a melting point of the electronic devices 3000, other devices 1020, substrate 2000, spacers 6000, any conductive traces, etc. and also less than a curing temperature of the underfill 5020. For example, the underfill 5020 may be heated to a temperature in a range of 30° C. to 120° C.

Applying a vacuum condition, either in step S703 during dispensing or in step S704 of de-airing, may include placing the electronic circuit assembly 100 in a vacuum chamber and evacuating the vacuum chamber to a sub-atmospheric pressure, which may not necessarily reflect a true or ideal vacuum (e.g., 90-100 Torr). A pressure of the vacuum chamber may be configured so as not to damage the electronic devices 3000 or detrimentally modify any properties of the underfill 5020.

In step S704, the vacuum condition may remove air trapped in the dispensed underfill 5020. Because spacers 6000 were mounted in step S702, there may be less likelihood of air pockets in the underfill 5020 and thus less spillage or bubbling during de-airing in step S704.

The method 700 may include removing the vacuum in step S705. Where the vacuum was applied using a vacuum chamber, removing the vacuum may mean removing the electronic circuit assembly 1000, including the dispensed and de-aired underfill 5020, from the vacuum chamber.

The method 700 may include, in step S705, curing the underfill 5020. The underfill 5020 may be cured by heating the underfill to a curing temperature (e.g., about 145° C.). The curing temperature may depend on a composition of the underfill 5020. The electronic circuit assembly 1000 may be placed in a curing oven to cure the underfill 5020. Once cured, the underfill 5020 may be a solid material that strongly bonds the electronic devices 3000 to the substrate 2000 and that protects against external conditions and mismatched CTEs between the electronic devices 3000 and the substrate 2000.

After curing, the electronic circuit assembly 1000 may be ready to be installed to a desired application. For example, the electronic circuit assembly 1000 may be ready for coating, as there may be no or minimal excess underfill 5020 that spilled over during the underfilling process. The electronic circuit assembly 1000 may be, for example, coated in an anodized coating or an electroless nickel coating for heat sink and/or inverter applications, such as in electrically-powered automobiles. Embodiments disclosed herein are not limited to certain coatings or applications of the final electronic circuit assembly 1000.

One of ordinary skill in the art will appreciate that the technical aspects disclosed herein may be applied to a wide range of semiconductor applications that may involve an underfilling process. The exemplary dimensions given for the electronic devices 3000, the spacers 6000, and the at least one substrate 2000 may be altered based on manufacturing needs, etc.

Embodiments disclosed herein may provide a way to decrease a volume filled by underfill and/or enhance capillary forces acting on the underfill to reduce a potential for air pockets and spilling over of the underfill. The embodiments disclosed herein may be readily suited for automation by using industry standard SMT spacers off the reel and mounting the spacers on a substrate at prescribed positions relative to electronic devices (e.g., dies, flip chips, diodes, etc.) and an edge of the substrate to create narrow passages to increase capillary forces on the underfill. Alternatively or in addition thereto, the spacers may be customized based on a circuitry layout on the substrate and/or dimensions of the electronic devices mounted on the substrate. Embodiments disclosed herein may be used in a wide range of underfilling methods where the underfill flows, at least in part, via capillary forces and/or in a wide range of underfilling methods where underfill tends to flow through a relatively large empty space above the substrate. Embodiments disclosed herein are not limited to any particular machinery, types of substrates, or types of electronic devices.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for underfilling an electronic circuit assembly, comprising:

mounting one or more structures to a substrate, the substrate including a silicon nitride ($Si_3N_4$) material, the one or more structures including one or more dies, the one or more dies includes a first die to be spaced apart from an edge by a first distance, the edge being an edge of the substrate or an edge of an adjacent structure among the one or more structures;

mounting one or more spacers to the substrate at one or more positions, respectively, to form one or more passages between the one or more spacers and the one or more structures, wherein the one or more spacers are soldered directly on the $Si_3N_4$ material with a soldering material that does not touch any conductive traces on the substrate, the one or more spacers including:

a first spacer mounted between the first die and the edge, wherein the first spacer is oriented such that a longer side of the first spacer extends in a direction between the first die and the edge; and a second spacer mounted between the first die and the edge, wherein the second spacer is oriented such that a longer side of the second spacer extends in a direction between the first die and the edge;

dispensing underfill to the one or more passages; and curing the underfill to secure the one or more structures to the substrate.

2. The method of claim 1, wherein:

mounting the one or more spacers to the substrate at the one or more positions includes mounting the first spacer at a first position to form a first passage between the first die and the first spacer and a second passage between the first spacer and the edge.

3. The method of claim 2, wherein the first passage has a first width less than 45% of the first distance, and the second passage has a second width less than 45% of the first distance.

4. The method of claim 2, wherein the first distance is in a range of 1.5 to 2.5 mm, and the first passage has a first width in a range of 0.1 mm to 0.9 mm.

5. The method of claim 1, wherein:

the one or more spacers has a width equal to at least 15% of the first distance.

6. The method of claim 1, wherein:

the first distance extends in a first direction;

the first die has a first length and the edge has a second length, the first and second lengths extending in a second direction; and the one or more spacers includes a plurality of spacers aligned in the second direction.

7. The method of claim 1, wherein:

the substrate is a first substrate and the one or more dies are mounted to the first substrate and a second substrate; and the one or more spacers are mounted to the first substrate.

8. The method of claim 7, wherein, during dispensing underfill to the one or more passages, the first and second substrates are oriented vertically.

9. The method of claim 1, wherein the one or more spacers are not electrically connected to any conductive traces.

10. The method of claim 1, wherein the one or more spacers has a height of at least 75% a height of the die.

11. The method of claim 1, wherein a height of the one or more spacers is in a range of 0.15-0.18 mm, and a height of the one or more dies is in a range of 0.17-0.20 mm.

12. The method of claim 7, wherein a sum of volumes between the first and second substrate of each of the one or more spacers is equal to at least 10% of a reference volume, wherein the reference volume is a sum of volumes of each of the one or more structures subtracted from an initial substrate volume.

13. The method of claim 1, wherein the one or more dies includes a silicon carbide (SiC) die, and the substrate is a silicon nitride ($Si_3N_4$) substrate.

14. The method of claim 1, further comprising:

applying a vacuum to the electronic circuit assembly to remove air trapped in the dispensed underfill.

15. An electronic circuit assembly, comprising:

a substrate;

one or more structures mounted to the substrate, the one or more structures including a first die, wherein the substrate includes a silicon nitride ($Si_3N_4$) material; and one or more spacers mounted to the substrate, the one or more spacers including a first spacer mounted between the first die and an edge, the edge being an edge of a structure adjacent to the first die or an edge of the substrate adjacent to the first die; wherein:

the first die and the edge are spaced apart by a first distance, the first die and the first spacer are spaced apart by a second distance, the second distance is at least 70% less than the first distance, the one or more spacers are positioned to not interfere with any circuit throughout the electric circuit assembly; and the one or more spacers are soldered directly on the $Si_3N_4$ material with a soldering material that does not touch any conductive traces on the substrate.

16. The electronic circuit assembly of claim 15, wherein the first distance is in a range of 1.5 to 2.5 mm, and the second distance is in a range of 0.1 mm to 0.9 mm.

17. The electronic circuit assembly of claim 15, wherein:

a height of the first die is in a range of 0.17-0.20 mm; and a height of each of the one or more spacers is in a range of 0.15-0.18 mm.

18. A method for underfilling an electronic circuit assembly, comprising:

mounting one or more dies to a substrate, the substrate including a silicon nitride ($Si_3N_4$) material; the one or more dies including a first die;

the substrate is a first substrate and the one or more dies are mounted to the first substrate and a second substrate;

mounting one or more spacers to the substrate, wherein the one or more spacers are soldered directly on the $Si_3N_4$ material with a soldering material that does not touch any conductive traces on the substrate, a total volume of the one or more spacers being configured to fill at least 10% of space between the first substrate and the second substrate, the one or more spacers including a first spacer mounted between the first die and an edge, the edge being an edge of the first substrate adjacent to the first die, the first spacer is oriented such that a longer side of the first spacer extends in a direction between the first die and the edge;

dispensing underfill at a location configured to compel a flow of the underfill between the one or more spacers and the one or more dies; and curing the underfill to secure the one or more dies to the substrate.

19. The method of claim 18, wherein mounting one or more spacers to the substrate further includes:

mounting a second spacer between the first die and the edge, the second spacer being oriented such that a longer side of the second spacer extends in a direction between the first die and the edge.

* * * * *

UNITED STATES PATENT AND TRADEMARK OFFICE
CERTIFICATE OF CORRECTION

PATENT NO. : 11,948,809 B2
APPLICATION NO. : 17/474674
DATED : April 2, 2024
INVENTOR(S) : Whei Sheng Tan Page 1 of 1

It is certified that error appears in the above-identified patent and that said Letters Patent is hereby corrected as shown below:

In the Claims
Column 22, Line 25, delete "electric" and insert --electronic--.

Signed and Sealed this
Eleventh Day of June, 2024

Katherine Kelly Vidal
*Director of the United States Patent and Trademark Office*